(12) United States Patent
Tsuda et al.

(10) Patent No.: US 11,905,409 B2
(45) Date of Patent: Feb. 20, 2024

(54) RESIN COMPOSITION, AND PREPREG, RESIN-COATED FILM, RESIN-COATED METAL FOIL, METAL-CLAD LAMINATE, AND WIRING BOARD EACH OBTAINED USING SAID RESIN COMPOSITION

(71) Applicant: PANASONIC INTELLECTUAL PROPERTY MANAGEMENT CO., LTD., Osaka (JP)

(72) Inventors: Kosuke Tsuda, Osaka (JP); Hirosuke Saito, Osaka (JP); Yiqun Wang, Osaka (JP); Hiroharu Inoue, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 18/112,837

(22) Filed: Feb. 22, 2023

(65) Prior Publication Data
US 2023/0193024 A1    Jun. 22, 2023

Related U.S. Application Data

(63) Continuation of application No. PCT/JP2021/028725, filed on Aug. 3, 2021.

(30) Foreign Application Priority Data

Sep. 1, 2020   (JP) .................. 2020-146564

(51) Int. Cl.
| | | |
|---|---|---|
| B32B 3/00 | (2006.01) |
| C08L 71/12 | (2006.01) |
| C08J 5/24 | (2006.01) |
| C08J 5/18 | (2006.01) |
| C08K 3/36 | (2006.01) |
| H05K 1/03 | (2006.01) |

(52) U.S. Cl.
CPC .............. *C08L 71/126* (2013.01); *C08J 5/18* (2013.01); *C08J 5/249* (2021.05); *C08K 3/36* (2013.01); *H05K 1/0373* (2013.01); *C08J 2371/12* (2013.01); *C08J 2425/16* (2013.01); *C08J 2453/02* (2013.01); *C08L 2203/16* (2013.01)

(58) Field of Classification Search
CPC ..................................... C08L 71/126
See application file for complete search history.

(56) References Cited

U.S. PATENT DOCUMENTS

| | | |
|---|---|---|
| 2020/0377676 A1 | 12/2020 | Liu et al. |
| 2022/0185960 A1 | 6/2022 | Otsuka et al. |

FOREIGN PATENT DOCUMENTS

| | | | | |
|---|---|---|---|---|
| CN | 106609031 B | * | 11/2018 | ............. B32B 15/14 |
| JP | 2015-086330 A | | 5/2015 | |
| WO | WO-2019131306 A1 | * | 7/2019 | ............. B32B 15/08 |
| WO | 2020/196718 A1 | | 10/2020 | |

OTHER PUBLICATIONS

ISR issued in WIPO Patent Application No. PCT/JP2021/028725, dated Oct. 12, 2021, translation.

* cited by examiner

*Primary Examiner* — Elizabeth E Mulvaney
(74) *Attorney, Agent, or Firm* — GREENBLUM & BERNSTEIN, P.L.C.

(57) ABSTRACT

An aspect of the present invention relates to a resin composition containing a polyphenylene ether compound having at least one of the groups represented by Formulas (1) and (2); and an allyl compound having a group represented by Formula (3).

16 Claims, 5 Drawing Sheets

RESIN COMPOSITION, AND PREPREG, RESIN-COATED FILM, RESIN-COATED METAL FOIL, METAL-CLAD LAMINATE, AND WIRING BOARD EACH OBTAINED USING SAID RESIN COMPOSITION

TECHNICAL FIELD

The present invention relates to a resin composition, and a prepreg, a film with resin, a metal foil with resin, a metal-clad laminate, and a wiring board obtained using the resin composition.

BACKGROUND ART

In recent years, in various electronic devices, mounting technique such as higher integration of semiconductor devices to be mounted, higher wiring density, and multi-layering have rapidly progressed along with an increase in the amount of information processed. Board materials for constituting substrates of wiring boards used in various electronic devices are required to have a low dielectric constant and a low dielectric loss tangent to increase the transmission speed of signals and decrease the loss during signal transmission.

It is known that polyphenylene ether (PPE) exhibits excellent dielectric properties such as a low dielectric constant and a low dielectric loss tangent and exhibits excellent dielectric properties such as dielectric constant and dielectric loss tangent in a high frequency band (high frequency region) from the MHz band to the GHz band as well. For this reason, it has been investigated that polyphenylene ether is used, for example, as a high frequency molding material. More specifically, polyphenylene ether is preferably used as a board material for forming a substrate of a wiring board to be equipped in electronic equipment utilizing a high frequency band.

For example, Patent Literature 1 discloses a resin composition containing a modified polyphenylene ether compound and triallyl isocyanurate (TAIC), divinylbenzene and the like as a cross-linking curing agent having a carbon-carbon unsaturated double bond. According to the resin composition disclosed in Patent Literature 1, it is possible to provide a cured product having a low dielectric constant, a low dielectric loss tangent, and excellent heat resistance.

The resin composition described in Patent Literature 1 is an excellent resin composition from the viewpoint of low dielectric properties and heat resistance, but the research by the present inventors revealed that the crosslink density increases by the three-dimensional crosslinkability of the resin in the case of a copper-clad laminate including an insulating layer containing a cured product of a resin composition containing a cross-linking curing agent as described above and a metal foil on both sides of the insulating layer. It is considered that the toughness of the resin becomes insufficient as the crosslink density increases, and there is a problem that the cured product cracks during the etching treatment for forming wiring or the like, for example, in a case where a resin composition that does not contain glass cloth is cured.

In view of the above, it is required to develop a resin composition capable of affording a cured product exhibiting properties such as low dielectric properties and heat resistance as well as toughness enough to withstand etching treatment.

CITATION LIST

Patent Literature

Patent Literature 1: JP 2015-86330 A

SUMMARY OF INVENTION

The present invention is made in view of such circumstances, and an object thereof is to provide a resin composition capable of improving the toughness and handleability of its cured product while maintaining properties such as low dielectric properties and high Tg. Another object of the present invention is to provide a prepreg, a film with resin, a metal foil with resin, a metal-clad laminate, and a wiring board, which are obtained using the resin composition.

A resin composition according to an aspect of the present invention contains a polyphenylene ether compound having at least one of the groups represented by the following Formulas (1) and (2); and an allyl compound represented by the following Formula (3).

[Chemical formula 1]

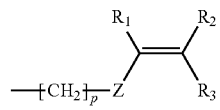

(1)

(In Formula (1), p represents an integer 0 to 10. Z represents an arylene group. $R_1$ to $R_3$ each independently represent a hydrogen atom or an alkyl group.)

[Chemical formula 2]

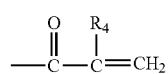

(2)

(In Formula (2), $R_4$ represents a hydrogen atom or an alkyl group.)

[Chemical formula 3]

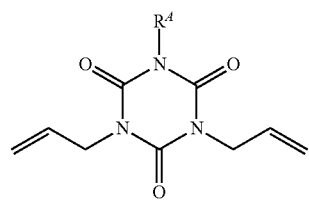

(3)

(In Formula (3), $R^4$ represents an alkyl or alkenyl group having 8 to 22 carbon atoms.)

DESCRIPTION OF EMBODIMENTS

Figure 1:
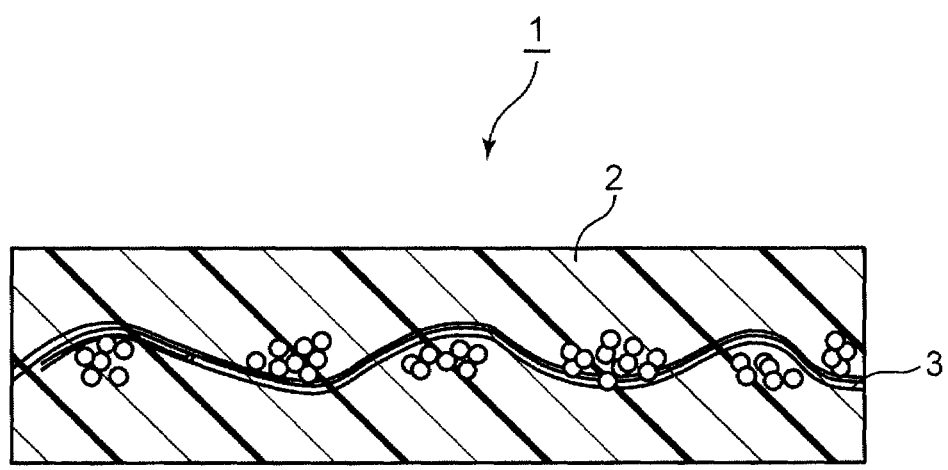
FIG. 1 is a schematic sectional view illustrating the configuration of a prepreg according to an embodiment of the present invention.

A resin composition according to an embodiment of the present invention (hereinafter also simply referred to as a resin composition) contains a polyphenylene ether compound having at least one of the groups represented by Formulas (1) and (2); and an allyl compound represented by Formula (3).

By containing the allyl compound in addition to the polyphenylene ether compound, it is possible to provide a resin composition that affords a cured product exhibiting excellent handleability and toughness in addition to low dielectric properties and high Tg (glass transition temperature). It is considered that this is because an increase in the crosslink density due to the three-dimensional crosslinkability of the resin can be suppressed by the allyl compound to some extent.

In other words, according to the present invention, it is possible to provide a resin composition capable of improving the toughness and handleability of its cured product while maintaining excellent properties such as low dielectric properties and high Tg. By using the resin composition, it is possible to provide a prepreg, a film with resin, a metal foil with resin, a metal-clad laminate, and a wiring board, which exhibit high toughness, excellent handleability, and properties such as low dielectric properties and high Tg.

As for the material properties, a material imparting a high Tg to a cured product is one of the factors for further improvement in heat resistance (solder heat resistance and the like). Furthermore, a material imparting a high Tg to a cured product has also the advantage that the coefficient of thermal expansion of the material becomes a small value in a higher temperature region. This is because thermal expansion generally increases sharply at a temperature exceeding the glass transition temperature. In other words, when the glass transition temperature is low, the coefficient of thermal expansion increases in a high temperature region exceeding the glass transition temperature. When the glass transition temperature is low, the thermal expansion in a higher temperature region increases. For example, interlayer connection reliability (such as occurrence of barrel cracks in through-holes) in the wiring board deteriorates and there is a risk that the wiring board does not function as a printed board. It is considered that this is because the wall surface of the through-hole formed of metal cracks and the connection reliability deteriorates since the difference in coefficient of thermal expansion at high temperatures between the insulating layer formed of a cured product of the resin composition and the material of the through-hole formed of metal increases in the board.

Hereinafter, the respective components of the resin composition according to the present embodiment will be first described specifically.

Polyphenylene Ether Compound

The polyphenylene ether compound used in the present embodiment is a modified polyphenylene ether compound that can exert excellent low dielectric properties when cured, and is not particularly limited as long as it is a polyphenylene ether compound having at least one of the groups represented by the following Formulas (1) and (2). It is considered that a resin composition, which can afford a cured product exhibiting low dielectric properties and high heat resistance, is obtained by containing such a modified polyphenylene ether compound.

[Chemical formula 4]

(1)

In Formula (1), p represents an integer 0 to 10. Z represents an arylene group. $R_1$ to $R_3$ are independent of each other. In other words, $R_1$ to $R_3$ may be the same group as or different groups from each other. $R_1$ to $R_3$ represent a hydrogen atom or an alkyl group.

In a case where s in Formula (1) is 0, it indicates that Z is directly bonded to the terminal of polyphenylene ether.

The arylene group of Z is not particularly limited. Examples of this arylene group include a monocyclic aromatic group such as a phenylene group, and a polycyclic aromatic group in which the aromatic is not a single ring but a polycyclic aromatic such as a naphthalene ring. This arylene group also includes a derivative in which a hydrogen atom bonded to an aromatic ring is substituted with a functional group such as an alkenyl group, an alkynyl group, a formyl group, an alkylcarbonyl group, an alkenylcarbonyl group, or an alkynylcarbonyl group. In addition, the alkyl group is not particularly limited and is, for example, preferably an alkyl group having 1 to 18 carbon atoms and more preferably an alkyl group having 1 to 10 carbon atoms. Specific examples thereof include a methyl group, an ethyl group, a propyl group, a hexyl group, and a decyl group.

[Chemical formula 5]

(2)

In Formula (2), $R_4$ represents a hydrogen atom or an alkyl group. The alkyl group is not particularly limited and is, for example, preferably an alkyl group having 1 to 18 carbon atoms and more preferably an alkyl group having 1 to 10 carbon atoms. Specific examples thereof include a methyl group, an ethyl group, a propyl group, a hexyl group, and a decyl group.

Preferred specific examples of the substituent represented by Formula (1) include, for example, a substituent having a vinylbenzyl group. Examples of the substituent having a vinylbenzyl group include a substituent represented by the following Formula (4). Examples of the substituent represented by Formula (2) include an acrylate group and a methacrylate group.

[Chemical formula 6]

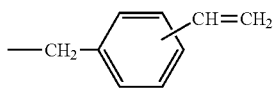
(4)

More specific examples of the substituent include vinylbenzyl groups (ethenylbenzyl groups) such as a p-ethenylbenzyl group and an m-ethenylbenzyl group, a vinylphenyl group, an acrylate group, and a methacrylate group.

The polyphenylene ether compound has a polyphenylene ether chain in the molecule and preferably has, for example, a repeating unit represented by the following Formula (5) in the molecule.

[Chemical formula 7]

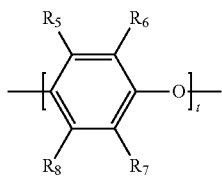
(5)

In Formula (5), t represents 1 to 50. $R_5$ to $R_8$ are independent of each other. In other words, $R_5$ to $R_8$ may be the same group as or different groups from each other. $R_5$ to $R_8$ represent a hydrogen atom, an alkyl group, an alkenyl group, an alkynyl group, a formyl group, an alkylcarbonyl group, an alkenylcarbonyl group, or an alkynylcarbonyl group. Among these, a hydrogen atom and an alkyl group are preferable.

Specific examples of the respective functional groups mentioned in $R_5$ to $R_8$ include the following.

The alkyl group is not particularly limited and is, for example, preferably an alkyl group having 1 to 18 carbon atoms and more preferably an alkyl group having 1 to 10 carbon atoms. Specific examples thereof include a methyl group, an ethyl group, a propyl group, a hexyl group, and a decyl group.

The alkenyl group is not particularly limited and is, for example, preferably an alkenyl group having 2 to 18 carbon atoms and more preferably an alkenyl group having 2 to 10 carbon atoms. Specific examples thereof include a vinyl group, an allyl group, and a 3-butenyl group.

The alkynyl group is not particularly limited and is, for example, preferably an alkynyl group having 2 to 18 carbon atoms and more preferably an alkynyl group having 2 to 10 carbon atoms. Specific examples thereof include an ethynyl group and a prop-2-yn-1-yl group (propargyl group).

The alkylcarbonyl group is not particularly limited as long as it is a carbonyl group substituted with an alkyl group and is, for example, preferably an alkylcarbonyl group having 2 to 18 carbon atoms and more preferably an alkylcarbonyl group having 2 to 10 carbon atoms. Specific examples thereof include an acetyl group, a propionyl group, a butyryl group, an isobutyryl group, a pivaloyl group, a hexanoyl group, an octanoyl group, and a cyclohexylcarbonyl group.

The alkenylcarbonyl group is not particularly limited as long as it is a carbonyl group substituted with an alkenyl group and is, for example, preferably an alkenylcarbonyl group having 3 to 18 carbon atoms and more preferably an alkenylcarbonyl group having 3 to 10 carbon atoms. Specific examples thereof include an acryloyl group, a methacryloyl group, and a crotonoyl group.

The alkynylcarbonyl group is not particularly limited as long as it is a carbonyl group substituted with an alkynyl group and is, for example, preferably an alkynylcarbonyl group having 3 to 18 carbon atoms and more preferably an alkynylcarbonyl group having 3 to 10 carbon atoms. Specific examples thereof include a propioloyl group.

The weight average molecular weight (Mw) of the polyphenylene ether compound is not particularly limited. Specifically, the weight average molecular weight is preferably 500 to 5000, more preferably 800 to 4000, and still more preferably 1000 to 3000. The weight average molecular weight may be measured by a general molecular weight measurement method, and specific examples thereof include a value measured by gel permeation chromatography (GPC). In a case where the polyphenylene ether compound has a repeating unit represented by Formula (5) in the molecule, t is preferably a numerical value so that the weight average molecular weight of the polyphenylene ether compound is in such a range. Specifically, t is preferably 1 to 50.

When the weight average molecular weight of the polyphenylene ether compound is in such a range, the polyphenylene ether compound exhibits the excellent low dielectric properties of polyphenylene ether and not only imparts superior heat resistance to the cured product but also exhibits excellent moldability. This is considered to be due to the following. When the weight average molecular weight of ordinary polyphenylene ether is in such a range, the heat resistance of the cured product tends to decrease since the molecular weight is relatively low. With regard to this point, since the polyphenylene ether compound according to the present embodiment has one or more unsaturated double bonds at the terminal, it is considered that a cured product exhibiting sufficiently high heat resistance is obtained. When the weight average molecular weight of the polyphenylene ether compound is within such a range, the polyphenylene ether compound has a relatively low molecular weight and is thus considered to exhibit excellent moldability as well. Hence, it is considered that such a polyphenylene ether compound not only imparts superior heat resistance to the cured product but also exhibits excellent moldability.

In the polyphenylene ether compound, the average number of the substituents (number of terminal functional groups) at the molecule terminal per one molecule of the polyphenylene ether compound is not particularly limited. Specifically, the average number is preferably 1 to 5, more preferably 1 to 3, and still more preferably 1.5 to 3. When the number of terminal functional groups is too small, sufficient heat resistance of the cured product tends to be hardly attained. When the number of terminal functional groups is too large, the reactivity is too high and, for example, troubles such as deterioration in the storage stability of the resin composition or deterioration in the fluidity of the resin composition may occur. In other words, when such a polyphenylene ether compound is used, for example, molding defects such as generation of voids at the time of multilayer molding occur by insufficient fluidity and the like and a problem of moldability that a highly reliable printed wiring board is hardly obtained may occur.

The number of terminal functional groups in the polyphenylene ether compound includes a numerical value expressing the average value of the substituents per one molecule of all the modified polyphenylene ether compounds present in 1 mole of the polyphenylene ether compound. This number of terminal functional groups can be determined, for example, by measuring the number of hydroxyl groups remaining in the obtained modified polyphenylene ether compound and calculating the number of hydroxyl groups decreased from the number of hydroxyl groups in the polyphenylene ether before being modified. The number of hydroxyl groups decreased from the number of hydroxyl groups in the polyphenylene ether before being modified is the number of terminal functional groups. With regard to the method for measuring the number of hydroxyl groups remaining in the modified polyphenylene ether compound, the number of hydroxyl groups can be determined by adding a quaternary ammonium salt (tetraethylammonium hydroxide) to be associated with a hydroxyl group to a solution of the modified polyphenylene ether compound and measuring the UV absorbance of the mixed solution.

The intrinsic viscosity of the polyphenylene ether compound of the present embodiment is not particularly limited. Specifically, the intrinsic viscosity is preferably 0.03 to 0.12 dl/g, more preferably 0.04 to 0.11 dl/g, still more preferably 0.06 to 0.095 dl/g. When the intrinsic viscosity is too low, the molecular weight tends to be low and low dielectric properties such as a low dielectric constant and a low dielectric loss tangent tend to be hardly attained. When the intrinsic viscosity is too high, the viscosity is high, sufficient fluidity is not attained, and the moldability of the cured product tends to decrease. Hence, when the intrinsic viscosity of the polyphenylene ether compound is within the above range, excellent heat resistance and moldability of the cured product can be realized.

Note that the intrinsic viscosity here is an intrinsic viscosity measured in methylene chloride at 25° C. and more specifically is, for example, a value attained by measuring the intrinsic viscosity of a methylene chloride solution (liquid temperature: 25° C.) at 0.18 g/45 ml using a viscometer. Examples of the viscometer include AVS500 Visco System manufactured by SCHOTT Instruments GmbH.

Examples of the polyphenylene ether compound of the present embodiment include modified polyphenylene ether compounds represented by the following Formulas (6) to (8). Moreover, as the polyphenylene ether compound of the present embodiment, these modified polyphenylene ether compounds may be used singly or these modified polyphenylene ether compounds may be used in combination.

[Chemical formula 8]

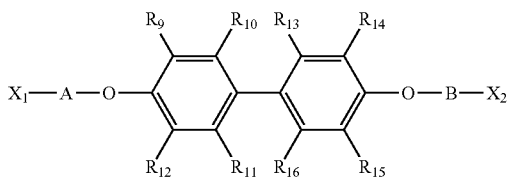

(6)

[Chemical formula 9]

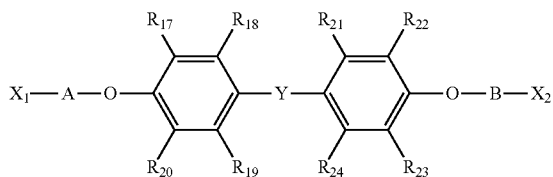

(7)

[Chemical formula 10]

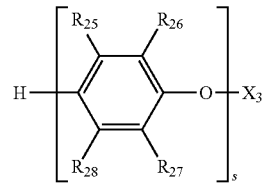

(8)

In Formulas (6) to (8), $R_9$ to $R_{16}$, $R_{17}$ to $R_{24}$ and $R_{25}$ to $R_{28}$ are independent of one another. In other words, $R_9$ to $R_{16}$, $R_{17}$ to $R_{24}$ and $R_{25}$ to $R_{28}$ may be the same group as or different groups from one another. $R_9$ to $R_{16}$, $R_{17}$ to $R_{24}$ and $R_{25}$ to $R_{28}$ represent a hydrogen atom, an alkyl group, an alkenyl group, an alkynyl group, a formyl group, an alkylcarbonyl group, an alkenylcarbonyl group, or an alkynylcarbonyl group.

In Formula (8), s represents an integer 1 to 100.

Specific examples of the respective functional groups mentioned above as $R_9$ to $R_{16}$, $R_{17}$ to $R_{24}$ and $R_{25}$ to $R_{28}$ include the following.

The alkyl group is not particularly limited and is, for example, preferably an alkyl group having 1 to 18 carbon atoms and more preferably an alkyl group having 1 to 10 carbon atoms. Specific examples thereof include a methyl group, an ethyl group, a propyl group, a hexyl group, and a decyl group.

The alkenyl group is not particularly limited, but for example, an alkenyl group having 2 to 18 carbon atoms is preferable, and an alkenyl group having 2 to 10 carbon atoms is more preferable. Specific examples thereof include a vinyl group, an allyl group, and a 3-butenyl group.

The alkynyl group is not particularly limited, but for example, an alkynyl group having 2 to 18 carbon atoms is preferable, and an alkynyl group having 2 to 10 carbon atoms is more preferable. Specific examples thereof include an ethynyl group and a prop-2-yn-1-yl group (propargyl group).

The alkylcarbonyl group is not particularly limited as long as it is a carbonyl group substituted with an alkyl group, but for example, an alkylcarbonyl group having 2 to 18 carbon atoms is preferable, and an alkylcarbonyl group having 2 to 10 carbon atoms is more preferable. Specific examples thereof include an acetyl group, a propionyl group, a butyryl group, an isobutyryl group, a pivaloyl group, a hexanoyl group, an octanoyl group, and a cyclohexylcarbonyl group.

The alkenylcarbonyl group is not particularly limited as long as it is a carbonyl group substituted with an alkenyl group, but for example, an alkenylcarbonyl group having 3 to 18 carbon atoms is preferable, and an alkenylcarbonyl group having 3 to 10 carbon atoms is more preferable. Specific examples thereof include an acryloyl group, a methacryloyl group, and a crotonoyl group.

The alkynylcarbonyl group is not particularly limited as long as it is a carbonyl group substituted with an alkynyl group, but for example, an alkynylcarbonyl group having 3 to 18 carbon atoms is preferable, and an alkynylcarbonyl group having 3 to 10 carbon atoms is more preferable. Specific examples thereof include a propioloyl group.

A and B in Formulas (6) and (8) represent a repeating unit represented by the following Formula (9) and a repeating unit represented by the following Formula (10), respectively. In Formula (7), Y represents a linear, branched, or cyclic hydrocarbon having 20 or less carbon atoms.

[Chemical formula 11]

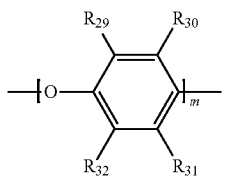

(9)

[Chemical formula 12]

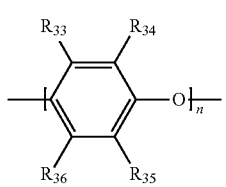

(10)

In Formulas (9) and (10), m and n each represent 0 to 20. In addition, it is preferable that m and n represent numerical values so that the sum of m and n is 1 to 30. Hence, it is more preferable that m represents 0 to 20, n represents 0 to 20, and the sum of m and n represents 1 to 30.

In Formulas (9) and (10), $R_{29}$ to $R_{32}$ and $R_{33}$ to $R_{36}$ are independent of one another, and $R_{29}$ to $R_{32}$ and $R_{33}$ to $R_{36}$ may be the same group as or different groups from one another, and represent a hydrogen atom, an alkyl group, an alkenyl group, an alkynyl group, a formyl group, an alkylcarbonyl group, an alkenylcarbonyl group, or an alkynylcarbonyl group.

In Formula (7), Y represents a linear, branched, or cyclic hydrocarbon having 20 or less carbon atoms as described above. Examples of Y include a group represented by the following Formula (11).

[Chemical formula 13]

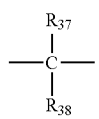

(11)

In Formula (11), $R_{37}$ and $R_{38}$ each independently represent a hydrogen atom or an alkyl group. Examples of the alkyl group include a methyl group. Examples of the group represented by Formula (11) include a methylene group, a methylmethylene group, and a dimethylmethylene group. Among these, a dimethylmethylene group is preferable.

In Formulas (6) to (8), $X_1$ to $X_3$ each independently represent the substituent represented by Formula (1) and/or the substituent represented by Formula (2). In the modified polyphenylene ether compounds represented by Formulas (6) to (8), $X_1$ to $X_3$ may be the same substituent as or different substituents from one another.

More specific examples of the modified polyphenylene ether compound represented by Formula (6) include a modified polyphenylene ether compound represented by the following Formula (12).

[Chemical formula 14]

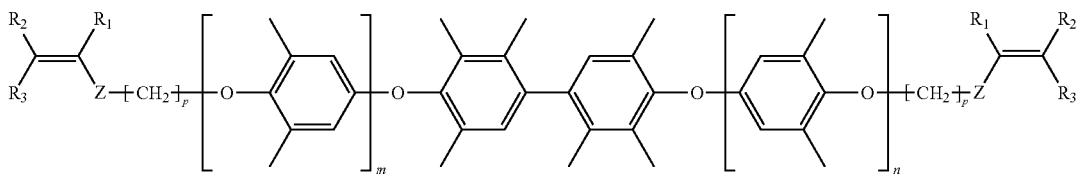

More specific examples of the modified polyphenylene ether compound represented by Formula (7) include a modified polyphenylene ether compound represented by the following Formula (13) and a modified polyphenylene ether compound represented by the following Formula (14).

[Chemical formula 15]

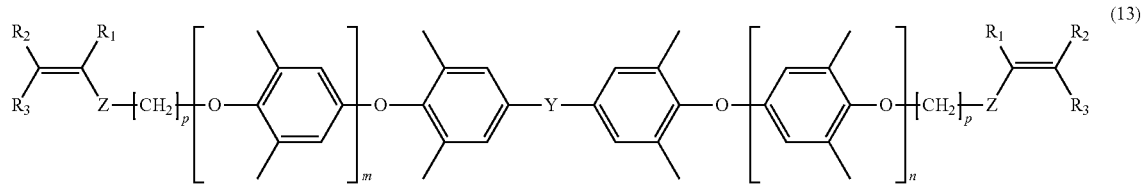

(13)

[Chemical formula 16]

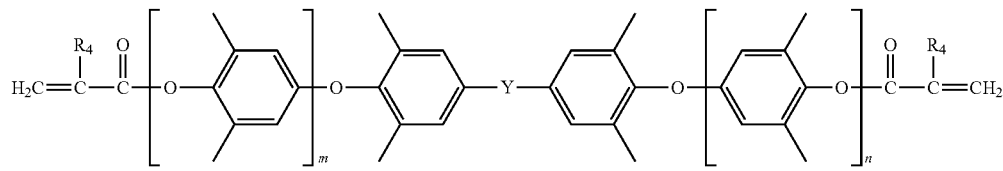

(14)

In Formulas (12) to (14), m and n are the same as m and n in Formulas (9) and (10). In Formulas (12) and (13), $R_1$ to $R_3$, p, and Z are the same as $R_1$ to $R_3$, p, and Z in Formula (1), respectively. In Formulas (13) and (14), Y is the same as Y in the above (7). In Formula (14), $R_4$ is the same as $R_4$ in Formula (2).

The method for synthesizing the polyphenylene ether compound used in the present embodiment is not particularly limited as long as a polyphenylene ether compound of which the terminal is modified with a group represented by Formula (1) and/or a group represented by Formula (2) can be synthesized. Specific examples thereof include a method in which polyphenylene ether is reacted with a compound in which a substituent having a carbon-carbon unsaturated double bond is bonded to a halogen atom.

Examples of the compound in which a substituent having a carbon-carbon unsaturated double bond is bonded to a halogen atom include compounds in which the substituents represented by Formulas (1), (2), and (5) are bonded to a halogen atom. Specific examples of the halogen atom include a chlorine atom, a bromine atom, an iodine atom, and a fluorine atom. Among these, a chlorine atom is preferable. More specific examples of the compound in which a substituent having a carbon-carbon unsaturated double bond is bonded to a halogen atom include p-chloromethylstyrene and m-chloromethylstyrene.

Polyphenylene ether which is a raw material is not particularly limited as long as a predetermined modified polyphenylene ether compound can be finally synthesized. Specific examples thereof include those containing polyphenylene ether containing 2,6-dimethylphenol and at least one of a bifunctional phenol and a trifunctional phenol and polyphenylene ether such as poly(2,6-dimethyl-1,4-phenylene oxide) as a main component. The bifunctional phenol is a phenol compound having two phenolic hydroxyl groups in the molecule, and examples thereof include tetramethyl bisphenol A. The trifunctional phenol is a phenol compound having three phenolic hydroxyl groups in the molecule.

Examples of the method for synthesizing the polyphenylene ether compound of the present embodiment include the methods described above. Specifically, polyphenylene ether as described above and a compound in which a substituent having a carbon-carbon unsaturated double bond is bonded to a halogen atom are dissolved in a solvent and stirred. By doing so, polyphenylene ether reacts with the compound in which a substituent having a carbon-carbon unsaturated double bond is bonded to a halogen atom, and the polyphenylene ether compound used in the present embodiment is obtained.

The reaction is preferably conducted in the presence of an alkali metal hydroxide. By doing so, it is considered that this reaction suitably proceeds. This is considered to be because the alkali metal hydroxide functions as a dehydrohalogenating agent, specifically, a dehydrochlorinating agent. In other words, it is considered that the alkali metal hydroxide eliminates the hydrogen halide from the phenol group in polyphenylene ether and the compound in which a substituent having a carbon-carbon unsaturated double bond is bonded to a halogen atom, and by doing so, the substituent having a carbon-carbon unsaturated double bond is bonded to the oxygen atom of the phenol group instead of the hydrogen atom of the phenol group in the polyphenylene ether.

The alkali metal hydroxide is not particularly limited as long as it can act as a dehalogenating agent, and examples thereof include sodium hydroxide. In addition, the alkali metal hydroxide is usually used in the form of an aqueous solution and is specifically used as an aqueous sodium hydroxide solution.

The reaction conditions such as reaction time and reaction temperature also vary depending on the compound in which a substituent having a carbon-carbon unsaturated double bond is bonded to a halogen atom and the like, and are not particularly limited as long as they are conditions under which the reaction as described above suitably proceeds. Specifically, the reaction temperature is preferably room temperature to 100° C. and more preferably 30° C. to 100° C. In addition, the reaction time is preferably 0.5 to 20 hours and more preferably 0.5 to 10 hours.

The solvent used at the time of the reaction is not particularly limited as long as it can dissolve polyphenylene ether and the compound in which a substituent having a carbon-carbon unsaturated double bond is bonded to a halogen atom, and does not inhibit the reaction of polyphenylene ether with the compound in which a substituent having a carbon-carbon unsaturated double bond is bonded to a halogen atom. Specific examples thereof include toluene.

The above reaction is preferably conducted in the presence of not only an alkali metal hydroxide but also a phase transfer catalyst. In other words, the above reaction is preferably conducted in the presence of an alkali metal hydroxide and a phase transfer catalyst. By doing so, it is considered that the above reaction more suitably proceeds. This is considered to be due to the following. This is considered to be because the phase transfer catalyst is a catalyst which has a function of taking in the alkali metal hydroxide, is soluble in both phases of a phase of a polar solvent such as water and a phase of a non-polar solvent such as an organic solvent, and can transfer between these phases. Specifically, in a case where an aqueous sodium hydroxide solution is used as an alkali metal hydroxide and an organic solvent, such as toluene, which is incompatible with water is used as a solvent, it is considered that when the aqueous sodium hydroxide solution is dropped into the solvent subjected to the reaction as well, the solvent and the aqueous sodium hydroxide solution are separated from each other and the sodium hydroxide is hardly transferred to the solvent. In that case, it is considered that the aqueous sodium hydroxide solution added as an alkali metal hydroxide hardly contributes to the promotion of the reaction. In contrast, when the reaction is conducted in the presence of an alkali metal hydroxide and a phase transfer catalyst, it is considered that the alkali metal hydroxide is transferred to the solvent in the state of being taken in the phase transfer catalyst and the aqueous sodium hydroxide solution is likely to contribute to the promotion of the reaction. For this reason, when the reaction is conducted in the presence of an alkali metal hydroxide and a phase transfer catalyst, it is considered that the above reaction more suitably proceeds.

The phase transfer catalyst is not particularly limited, and examples thereof include quaternary ammonium salts such as tetra-n-butylammonium bromide.

The resin composition used in the present embodiment preferably contains a modified polyphenylene ether compound obtained as described above as the polyphenylene ether compound.

Allyl Compound

As the allyl compound in the present embodiment, any allyl compound can be used without particular limitation as long as it serves as a so-called curing agent and is represented by the following Formula (3).

[Chemical formula 17]

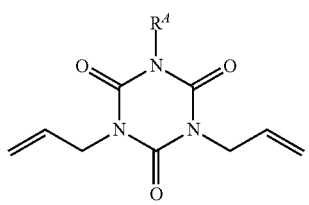

(3)

In Formula (3), $R^4$ represents an alkyl or alkenyl group having 8 to 22 carbon atoms. By using the allyl compound having an alkyl or alkenyl group having such a number of carbon atoms, it is possible to provide a resin composition which exhibits excellent crosslinkability and can afford a cured product exhibiting high toughness. This makes it possible to suppress cracking during etching treatment and the like in a case where the resin composition does not contain a substrate such as glass cloth as well.

From the viewpoint of improving handleability, it is still more desirable that the number of carbon atoms is more preferably 12 or more and 18 or less. It is thus considered that the resin flowability of the resin composition becomes favorable and superior circuit filling properties and the like are exhibited when a multilayer circuit board or the like is fabricated using the resin composition of the present embodiment.

In a preferred embodiment, the reactive group (allyl group) equivalent weight of the allyl compound is desirably 1000 or less. When the equivalent weight is 1000 or less, it is considered that a high Tg can be obtained more reliably.

Examples of the alkyl group having 8 to 22 carbon atoms include a linear or branched alkyl group, for example, an octyl group, a nonyl group, a decyl group, a dodecyl group, a tetradecyl group, a hexadecyl group, an octadecyl group, an eicosyl group and a docosyl group. Examples of the alkenyl group having 8 to 22 carbon atoms include a decenyl group.

Examples of specific allyl compounds used in the present embodiment include 5-octyl-1,3-diallyl isocyanurate, 5-dodecyl-1,3-diallyl isocyanurate, 5-tetradecyl-1,3-diallyl isocyanurate, 5-hexadecyl-1,3-diallyl isocyanurate, 5-octadecyl-1,3-diallyl isocyanurate, 5-eicosyl-1,3-diallyl isocyanurate, 5-docosyl-1,3-diallyl isocyanurate, and 5-decenyl-1,3-diallyl isocyanurate.

The method for producing such an allyl compound of the present embodiment is not particularly limited, but the allyl compound can be obtained by, for example, reacting diallyl isocyanurate and an alkyl halide in an aprotic polar solvent such as N,N'-dimethylformamide at a temperature of about 60° C. to 150° C. in the presence of a basic substance such as sodium hydroxide, potassium carbonate, triethylamine.

(Inorganic Filler)

The resin composition according to the present embodiment may further contain an inorganic filler. The inorganic filler is not particularly limited and includes those added to enhance the heat resistance and flame retardancy of the cured product of a resin composition. By containing an inorganic filler, it is considered that heat resistance, flame retardancy and the like can be further enhanced as well as an increase in the coefficient of thermal expansion can be suppressed.

Specific examples of the inorganic filler that can be used in the present embodiment include silica such as spherical silica, metal oxides such as alumina, titanium oxide, and mica, metal hydroxides such as aluminum hydroxide and magnesium hydroxide, talc, aluminum borate, barium sulfate, and calcium carbonate. Among these, silica, mica and talc are preferable and spherical silica is more preferable. The inorganic filler may be used singly or in combination of two or more kinds thereof. An inorganic filler as described above may be used as it is, but one subjected to a surface treatment with an epoxysilane-type, vinylsilane-type, methacrylsilane-type, or aminosilane-type silane coupling agent may be used. The silane coupling agent can be used by being added to the filler by an integral blend method instead of the method of treating the surface of the filler with the silane coupling agent in advance.

(Styrenic Polymer)

The resin composition of the present embodiment may contain a styrenic polymer other than the components as described above. By containing a styrenic polymer, it is considered that there are advantages such as improved handleability (resin flowability) when the resin composition is prepared in the form of a varnish and a further decrease in the dielectric constant of the resin.

The styrenic polymer used in the present embodiment is, for example, a polymer obtained by polymerizing a monomer containing a styrenic monomer, and may be a styrenic copolymer. Examples of the styrenic copolymer include a copolymer obtained by copolymerizing one or more styrenic monomers and one or more other monomers copolymerizable with the styrenic monomers. Examples of styrenic monomers include styrene and styrene derivatives.

As a specific styrenic polymer, conventionally known ones can be widely used, the styrenic polymer is not particularly limited, and examples thereof include a polymer having a structural unit represented by the following Formula (15) (a structure derived from a styrenic monomer) in the molecule.

[Chemical formula 18]

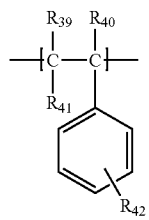

(15)

In Formula (15), $R_{39}$ to $R_{41}$ each independently represent a hydrogen atom or an alkyl group, and $R_{42}$ represents a group selected from the group consisting of a hydrogen atom, an alkyl group, an alkenyl group, and an isopropenyl group. The alkyl group is not particularly limited and is, for example, preferably an alkyl group having 1 to 18 carbon atoms and more preferably an alkyl group having 1 to 10 carbon atoms. The alkenyl group is preferably an alkenyl group having 1 to 10 carbon atoms. Specific examples thereof include a methyl group, an ethyl group, a propyl group, a hexyl group, and a decyl group.

The styrenic polymer of the present embodiment preferably contains at least one structural unit represented by Formula (15), but may contain two or more different structural units in combination. The styrenic polymer may contain a structure in which the structural unit represented by Formula (15) is repeated.

The styrenic polymer of the present embodiment may have at least one among the structural units represented by the following Formulas (16), (17) and (18) as another monomer copolymerizable with the styrenic monomer in addition to the structural unit represented by Formula (15).

[Chemical formula 19]

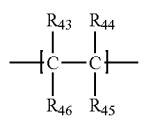

(16)

[Chemical formula 20]

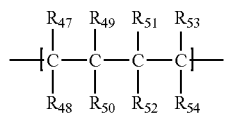

(17)

[Chemical formula 21]

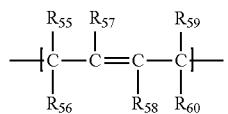

(18)

In Formulas (16), (17) and (18), $R_{43}$ to $R_{60}$ each independently represent any group selected from the group consisting of a hydrogen atom, an alkyl group, an alkenyl group, and an isopropenyl group. The alkyl group is not particularly limited and is, for example, preferably an alkyl group having 1 to 18 carbon atoms and more preferably an alkyl group having 1 to 10 carbon atoms. The alkenyl group is preferably an alkenyl group having 1 to 10 carbon atoms. Specific examples thereof include a methyl group, an ethyl group, a propyl group, a hexyl group, and a decyl group. The styrenic polymer of the present embodiment preferably contains at least one among the structural units represented by Formulas (16), (17) and (18), and may contain two or more different structural units among these in combination. The styrenic polymer may contain a structure in which the structural units represented by Formulas (16), (17) and/or (18) are repeated.

More specific examples of the structural unit represented by Formula (15) include structural units represented by the following Formulas (19) to (21). The structural unit represented by Formula (15) may be one structural unit among these or a combination of two or more different structural units. The structural unit represented by Formula (15) may also be a structure in which the structural units represented by Formulas (19) to (21) are each repeated.

[Chemical formula 22]

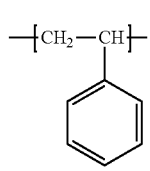

(19)

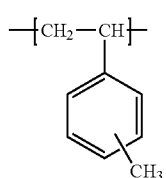

(20)

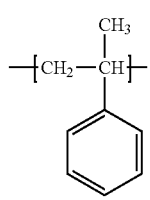

(21)

More specific examples of the structural unit represented by Formula (16) include structural units represented by the following Formulas (22) to (28). The structural unit represented by Formula (16) may be one structural unit among these or a combination of two or more different structural units. The structural unit represented by Formula (16) may also be a structure in which the structural units represented by Formulas (22) to (28) are each repeated.

[Chemical formula 23]

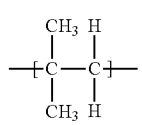

(22)

[Chemical formula 24]

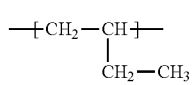

(23)

[Chemical formula 25]

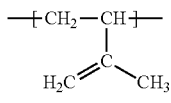
(24)

[Chemical formula 26]

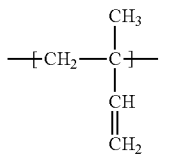
(25)

[Chemical formula 27]

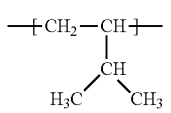
(26)

[Chemical formula 28]

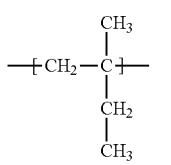
(27)

[Chemical formula 29]

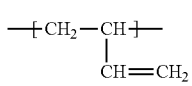
(28)

[Chemical formula 29]

More specific examples of the structural unit represented by Formula (17) include structural units represented by the following Formulas (29) and (30). The structural unit represented by Formula (17) may be one structural unit among these or a combination of two or more different structural units. The structural unit represented by Formula (17) may also be a structure in which the structural units represented by Formulas (29) and (30) are each repeated.

[Chemical formula 22]

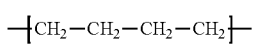
(29)

[Chemical formula 22]

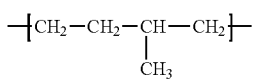
(30)

More specific examples of the structural unit represented by Formula (18) include structural units represented by the following Formulas (31) and (32). The structural unit represented by Formula (18) may be one structural unit among these or a combination of two or more different structural units. The structural unit represented by Formula (18) may also be a structure in which the structural units represented by Formulas (31) and (32) are each repeated.

[Chemical formula 32]

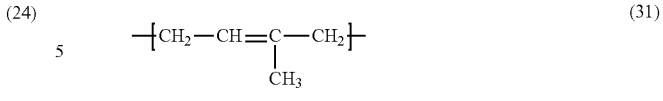
(31)

[Chemical formula 33]

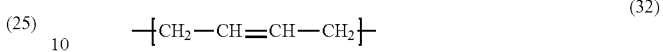
(32)

Preferred examples of the styrenic polymer include polymers or copolymers obtained by polymerizing or copolymerizing one or more styrenic monomers such as styrene, vinyltoluene, α-methylstyrene, isopropenyltoluene, divinylbenzene, or allylstyrene. More specific examples thereof include a styrene-butadiene copolymer, a styrene-isobutylene copolymer, and a styrene-isobutylene-styrene copolymer. The styrenic polymer may be a hydrogenated styrenic polymer, and examples thereof include a hydrogenated methylstyrene (ethylene/butylene) methylstyrene copolymer, a hydrogenated methylstyrene (ethylene-ethylene/propylene) methylstyrene copolymer, a hydrogenated styrene isoprene copolymer, a hydrogenated styrene isoprene styrene copolymer, a hydrogenated styrene (ethylene/butylene) styrene copolymer, and a hydrogenated styrene (ethylene-ethylene/propylene) styrene copolymer.

As the styrenic polymer, those exemplified above may be used singly or in combination of two or more kinds thereof.

In a case where the styrenic polymer contains at least one among the structural units represented by Formulas (19) to (21), the molar fraction of the structural unit is preferably about 10% to 40%, more preferably about 15% to 35% with respect to the entire polymer. Thus, the compatibility with the resin can be maintained, so there is a further advantage that the uniformity of the properties inside the resin composition can be maintained.

The form of polymerization of the styrenic polymer is not particularly limited, and the styrenic polymer may be a block copolymer, an alternating copolymer, a random copolymer, a graft copolymer or the like. The form of the styrenic polymer may be the form of a liquid, solid, elastomer or the like, and the styrenic polymer may be hydrogenated.

The number average molecular weight of the styrenic polymer of the present embodiment is preferably about 50,000 to 200,000, more preferably about 50,000 to 150,000. When the number average molecular weight is within the above range, there is an advantage that it is possible to ensure appropriate resin fluidity in the B stage of the resin cured product. The number average molecular weight may be measured by a general molecular weight measurement method, and specific examples thereof include a value measured by gel permeation chromatography (GPC).

As the styrenic polymer of the present embodiment, commercially available products can also be used, and examples thereof include "SIBSTAR (registered trademark) 073T" manufactured by Kaneka Corporation, "SEPTON V9827" and "SEPTON 2002" manufactured by Kuraray Co., Ltd., and "Tuftec (registered trademark) H1041" manufactured by Asahi Kasei Corporation.

(Content of Each Component)

In the resin composition of the present embodiment, the content of the polyphenylene ether compound is preferably 10 to 90 parts by mass, more preferably 15 to 80 parts by mass, still more preferably 20 to 70 parts by mass with respect to 100 parts by mass of the sum of the polyphenylene ether compound and the allyl compound (and the styrenic polymer in the case of containing the styrenic polymer). In other words, the content percentage of the polyphenylene ether compound is preferably 10% to 90% by mass with respect to the components other than the inorganic filler in the resin composition. When the content of the polyphenylene ether compound is within the above range, it is considered that a resin composition that affords a cured product having low dielectric properties and high heat resistance is obtained more reliably.

The content of the allyl compound is preferably 10 to 50 parts by mass, more preferably 15 to 50 parts by mass with respect to 100 parts by mass of the sum of the polyphenylene ether compound and the allyl compound (and the styrenic polymer in the case of containing the styrenic polymer) in the resin composition. When the content of the allyl compound is within the above range, it is considered that the cured product of the resin composition exhibits superior toughness.

In a case where the resin composition of the present embodiment contains the styrenic polymer, the content of the styrenic polymer is preferably 10 to 60 parts by mass, more preferably 15 to 60 parts by mass with respect to 100 parts by mass of the sum of the polyphenylene ether compound, the allyl compound, and the styrenic polymer in the resin composition. When the content of the styrenic polymer is within the above range, it is considered that resin flowability, varnish handleability, and the like are further improved.

In a case where the resin composition of the present embodiment contains an inorganic filler, the content of the inorganic filler is preferably 50 to 300 parts by mass, more preferably 70 to 300 parts by mass, still more preferably 100 to 300 parts by mass with respect to 100 parts by mass of the sum of the polyphenylene ether compound and the allyl compound (and the styrenic polymer in the case of containing the styrenic polymer). When the content of the inorganic filler is within the above range, it is considered that an increase in the coefficient of thermal expansion of the cured product can be suppressed and an increase in resin flowability can be suppressed.

Other Components

The resin composition according to the present embodiment may contain components (other components) other than the components described above if necessary as long as the effects of the present invention are not impaired. As other components to be contained in the resin composition according to the present embodiment, for example, additives such as a reaction initiator, a silane coupling agent, a flame retardant, an antifoaming agent, an antioxidant, a heat stabilizer, an antistatic agent, an ultraviolet absorber, a dye or a pigment, a dispersant, and a lubricant may be further contained. The resin composition of the present embodiment may contain other thermosetting resins such as an epoxy resin, a maleimide resin, an aromatic hydrocarbon resin, and an aliphatic hydrocarbon resin other than the polyphenylene ether compound, the allyl compound, and the styrenic polymer.

The resin composition according to the present embodiment may further contain a reaction initiator (initiator) as described above. When the resin composition contains the polyphenylene ether compound, the curing agent, and the polymer as well, the curing reaction may proceed. However, a reaction initiator may be added since there is a case where it is difficult to raise the temperature until curing proceeds depending on the process conditions.

The reaction initiator is not particularly limited as long as it can promote the curing reaction of the resin composition. Specific examples thereof include a metal oxide, an azo compound, and a peroxide.

Specific examples of the metal oxide include metal salts of carboxylic acids.

Examples of the peroxide include α,α'-di(t-butylperoxy)diisopropylbenzene, 2,5-dimethyl-2,5-di(t-butylperoxy)-3-hexyne, benzoyl peroxide, 3,3',5,5'-tetramethyl-1,4-diphenoquinone, chloranil, 2,4,6-tri-t-butylphenoxyl, t-butylperoxyisopropyl monocarbonate, and azobisisobutyronitrile.

Specific examples of the azo compound include 2,2'-azobis(2,4,4-trimethylpentane), 2,2'-azobis(N-butyl-2-methylpropionamide), and 2,2'-azobis(2-methylbutyronitrile).

Among these, α,α'-di(t-butylperoxy)diisopropylbenzene is preferably used as a preferable reaction initiator. α,α'-Di(t-butylperoxy)diisopropylbenzene exhibits low volatility, thus does not volatilize at the time of drying and storage, and exhibits favorable stability. α,α'-Di(t-butylperoxy)diisopropylbenzene has a relatively high reaction initiation temperature and thus can suppress the promotion of the curing reaction at the time point at which curing is not required, for example, at the time of prepreg drying. By suppressing the curing reaction, it is possible to suppress a decrease in storage stability of the resin composition.

The reaction initiators as described above may be used singly or in combination of two or more kinds thereof.

In a case where the resin composition of the present embodiment contains the reaction initiator, the content of the reaction initiator is not particularly limited, but is, for example, preferably 0.5 to 2.0 parts by mass, more preferably 0.8 to 1.5 parts by mass, still more preferably 0.9 to 1.0 parts by mass with respect to 100 parts by mass of the sum of the polyphenylene ether compound and the allyl compound (and the styrenic polymer in the case of containing the styrenic polymer).

(Prepreg, Film with Resin, Metal-Clad Laminate, Wiring Board, and Metal Foil with Resin)

Next, a prepreg for wiring board, a metal-clad laminate, a wiring board, and a metal foil with resin obtained using the resin composition of the present embodiment will be described.

FIG. 1 is a schematic sectional view illustrating an example of a prepreg 1 according to an embodiment of the present invention. In the following description, the reference numerals denote: 1 prepreg, 2 resin composition or semi-cured product of resin composition, 3 fibrous substrate, 11 metal-clad laminate, 12 insulating layer, 13 metal foil, 14 wiring, 21 wiring board, 31 metal foil with resin, 32 and 42 resin layer, 41 film with resin, and 43 support film, respectively.

The prepreg 1 according to the present embodiment includes the resin composition containing the thermally expandable microcapsules or a semi-cured product 2 of the resin composition; and a fibrous substrate 3 as illustrated in FIG. 1. The prepreg 1 includes one in which the fibrous substrate 3 is present in the resin composition or semi-cured product 2 thereof. In other words, the prepreg 1 includes the resin composition or semi-cured product thereof; and the fibrous substrate 3 present in the resin composition or semi-cured product 2 thereof.

In the present embodiment, the "semi-cured product" is one in a state in which the resin composition is partly cured so as to be further cured. In other words, the semi-cured product is the resin composition in a semi-cured state (B-staged). For example, when a resin composition is heated, the viscosity of the resin composition first gradually decreases, then curing starts, and the viscosity gradually increases. In such a case, the semi-cured state includes a state in which the viscosity has started to increase but curing is not completed, and the like.

The prepreg to be obtained using the resin composition according to the present embodiment may include a semi-cured product of the resin composition as described above or include the uncured resin composition itself. In other words, the prepreg may be a prepreg including a semi-cured product of the resin composition (the resin composition in B stage) and a fibrous substrate, or may be a prepreg including the resin composition before curing (the resin composition in A stage) and a fibrous substrate. Specific examples of the prepreg include those in which a fibrous substrate is present in the resin composition. The resin composition or semi-cured product thereof may be one obtained by heating and drying the resin composition.

When the prepreg and the metal foil with resin, metal-clad laminate and the like to be described later are fabricated, the resin composition according to the present embodiment is often prepared in the form of a varnish and used as a resin varnish. Such a resin varnish is prepared, for example, as follows.

First, the respective components that can be dissolved in an organic solvent, such as a resin component and a reaction initiator, are put into an organic solvent and dissolved. At this time, heating may be performed if necessary. Thereafter, an inorganic filler and the like, which are components that do not dissolve in an organic solvent, are added to and dispersed in the solution until a predetermined dispersion state is achieved using a ball mill, a bead mill, a planetary mixer, a roll mill or the like, whereby a varnish-like resin composition is prepared. The organic solvent used here is not particularly limited as long as it dissolves the modified polyphenylene ether compound, the allyl compound, the styrenic polymer and the like and does not inhibit the curing reaction. Specific examples thereof include toluene, methyl ethyl ketone, cyclohexanone and propylene glycol monomethyl ether acetate. These may be used singly or two or more kinds thereof may be used concurrently.

Examples of the method for fabricating the prepreg 1 of the present embodiment using the varnish-like resin composition of the present embodiment include a method in which the fibrous substrate 3 is impregnated with the resin composition 2 in the form of a resin varnish and then drying is performed.

Specific examples of the fibrous substrate used in fabrication of the prepreg include glass cloth, aramid cloth, polyester cloth, LCP (liquid crystal polymer) nonwoven fabric, glass nonwoven fabric, aramid nonwoven fabric, polyester nonwoven fabric, pulp paper, and linter paper. When glass cloth is used, a laminate exhibiting excellent mechanical strength is obtained, and glass cloth subjected to flattening is particularly preferable. The glass cloth used in the present embodiment is not particularly limited, but examples thereof include glass cloth with low dielectric constant such as E glass, S glass, NE glass, Q glass, and L glass. Specifically, the flattening can be carried out, for example, by continuously pressing the glass cloth with press rolls at an appropriate pressure to flatten the yarn. As for the thickness of the fibrous substrate, for example, a fibrous substrate having a thickness of 0.01 to 0.3 mm can be generally used.

Impregnation of the fibrous substrate 3 with the resin varnish (resin composition 2) is performed by dipping, coating, or the like. This impregnation can be repeated multiple times if necessary. At this time, it is also possible to repeat impregnation using a plurality of resin varnishes having different compositions and concentrations, and adjust the composition (content ratio) and resin amount to the finally desired values.

The fibrous substrate 3 impregnated with the resin varnish (resin composition 2) is heated under desired heating conditions, for example, at 80° C. or more and 180° C. or less for 1 minute or more and 10 minutes or less. By heating, the solvent is volatilized from the varnish and the solvent is diminished or removed to obtain the prepreg 1 before curing (in A stage) or in a semi-cured state (B stage).

Figure 4:
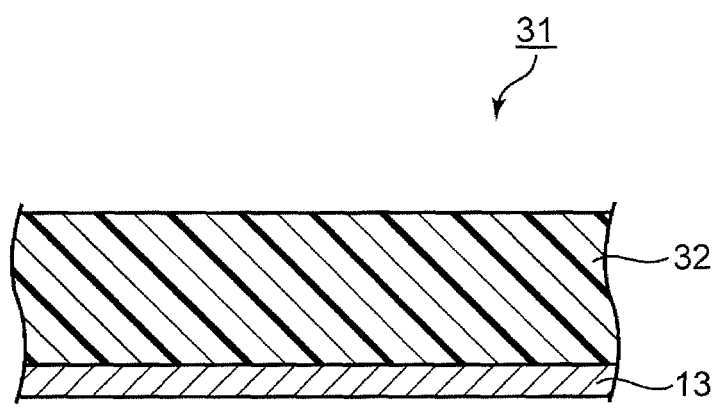
FIG. 4 is a schematic sectional view illustrating the configuration of a metal foil with resin according to an embodiment of the present invention.

As illustrated in FIG. 4, a metal foil with resin 31 of the present embodiment has a configuration in which a resin layer 32 containing the resin composition described above or a semi-cured product of the resin composition; and a metal foil 13 are laminated. In other words, the metal foil with resin of the present embodiment may be a metal foil with resin including a resin layer containing the resin composition before curing (the resin composition in A stage) and a metal foil, or may be a metal foil with resin including a resin layer containing a semi-cured product of the resin composition (the resin composition in B stage) and a metal foil.

Examples of the method for fabricating such a metal foil with resin 31 include a method in which a resin composition in the form of a resin varnish as described above is applied to the surface of the metal foil 13 such as a copper foil and then dried. Examples of the coating method include a bar coater, a comma coater, a die coater, a roll coater, and a gravure coater.

As the metal foil 13, metal foils used in metal-clad laminates, wiring boards and the like can be used without limitation, and examples thereof include copper foil and aluminum foil.

Figure 5:
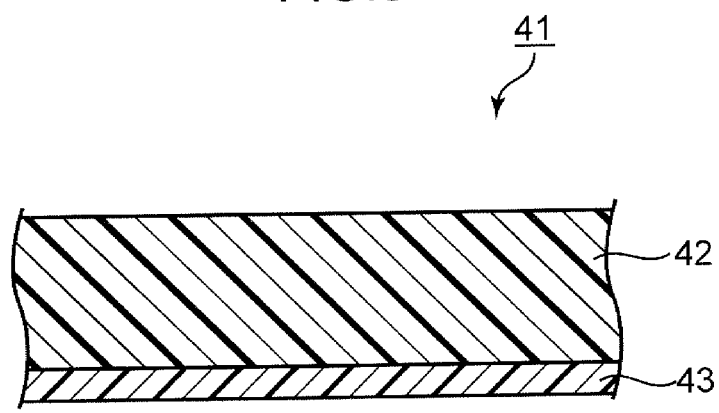
FIG. 5 is a schematic sectional view illustrating the configuration of a film with resin according to an embodiment of the present invention.

As illustrated in FIG. 5, a film with resin 41 of the present embodiment has a configuration in which a resin layer 42 containing the resin composition described above or a semi-cured product of the resin composition; and a film supporting substrate 43 are laminated. In other words, the film with resin of the present embodiment may be a film with resin including the resin composition before curing (the resin composition in A stage); and a film supporting substrate, or may be a film with resin including a semi-cured product of the resin composition (the resin composition in B stage); and a film supporting substrate.

As the method for fabricating such a film with resin 41, for example, a resin composition in the form of a resin varnish as described above is applied to the surface of the film supporting substrate 43, and then the solvent is volatilized from the varnish and diminished or removed, whereby a film with resin before curing (in A stage) or in a semi-cured state (B stage) can be obtained.

Examples of the film supporting substrate include electrical insulating films such as a polyimide film, a PET (polyethylene terephthalate) film, a polyester film, a poly (parabanic acid) film, a polyether ether ketone film, a polyphenylene sulfide film, an aramid film, a polycarbonate film, and a polyarylate film.

In the film with resin and metal foil with resin of the present embodiment, the resin composition or semi-cured product thereof may be one obtained by drying or heating and drying the resin composition as in the prepreg described above.

The thickness and the like of the metal foil 13 and the film supporting substrate 43 can be appropriately set depending on the desired purpose. For example, as the metal foil 13, a metal foil having a thickness of about 0.2 to 70 μm can be used. In a case where the thickness of metal foil is, for example, 10 μm or less, the metal foil may be a carrier-attached copper foil including a release layer and a carrier in order to improve handleability. The application of the resin varnish to the metal foil 13 and the film supporting substrate 43 is performed by coating or the like, and this can be repeated multiple times if necessary. At this time, it is also possible to repeat coating using a plurality of resin varnishes having different compositions and concentrations, and adjust the composition (content ratio) and resin amount to the finally desired values.

Drying or heating and drying conditions in the fabrication method of the metal foil with resin 31 and the film with resin 41 are not particularly limited, but a resin composition in the form of a resin varnish is applied to the metal foil 13 and the film supporting substrate 43, and then heating is performed under desired heating conditions, for example, at 80° C. to 170° C. for about 1 to 10 minutes to volatilize the solvent from the varnish and diminish or remove the solvent, whereby the metal foil with resin 31 and film with resin 41 before curing (in A stage) or in a semi-cured state (B stage) are obtained.

The metal foil with resin 31 and film with resin 41 may include a cover film and the like if necessary. By including a cover film, it is possible to prevent foreign matter from entering. The cover film is not particularly limited as long as it can be peeled off without damaging the form of the resin composition, and for example, a polyolefin film, a polyester film, a TPX film, films formed by providing a mold releasing agent layer on these films, and paper obtained by laminating these films on a paper substrate can be used.

Figure 2:
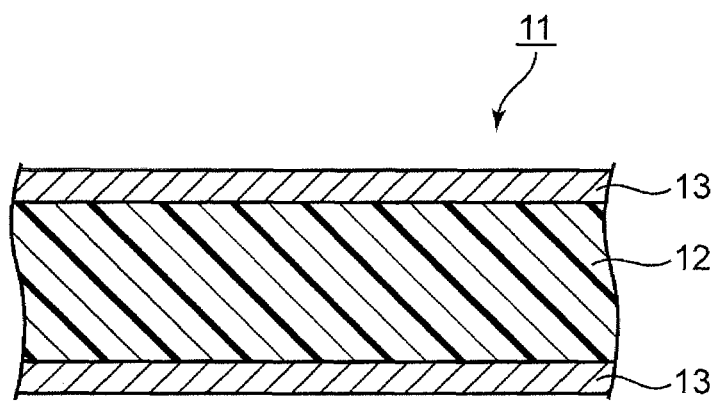
FIG. 2 is a schematic sectional view illustrating the configuration of a metal-clad laminate according to an embodiment of the present invention.

As illustrated in FIG. 2, a metal-clad laminate 11 of the present embodiment includes an insulating layer 12 containing a cured product of the resin composition described above or a cured product of the prepreg described above; and a metal foil 13. As the metal foil 13 used in the metal-clad laminate 11, a metal foil similar to the metal foil 13 described above can be used.

The metal-clad laminate 11 of the present embodiment can also be fabricated using the metal foil with resin 31 or film with resin 41 described above.

As the method for fabricating a metal-clad laminate using the prepreg 1, metal foil with resin 31, or film with resin 41 obtained in the manner described above, one or a plurality of prepregs 1, metals foil with resin 31, or films with resin 41 are superimposed one on another, and the metal foils 13 such as copper foil are further superimposed on both upper and lower sides or on one side, and this is laminated and integrated by heating and pressing, whereby a double-sided metal-clad or single-sided metal-clad laminate can be fabricated. The heating and pressing conditions can be appropriately set depending on the thickness of the laminate to be fabricated, the kind of the resin composition, and the like, but for example, the temperature may be set to 170° C. to 220° C., the pressure may be set to 1.5 to 5.0 MPa, and the time may be set to 60 to 150 minutes.

The metal-clad laminate 11 may be fabricated by forming a film-like resin composition on the metal foil 13 without using the prepreg 1 or the like and performing heating and pressing.

Figure 3:
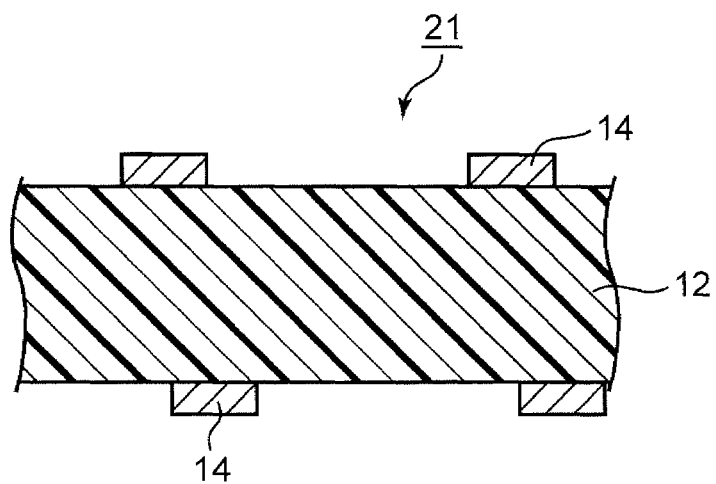
FIG. 3 is a schematic sectional view illustrating the configuration of a wiring board according to an embodiment of the present invention.

As illustrated in FIG. 3, a wiring board 21 of the present embodiment includes wiring 14 and an insulating layer 12 containing a cured product of the resin composition described above or a cured product of the prepreg described above.

The resin composition of the present embodiment is suitably used as a material for an insulating layer of a wiring board. As the method for fabricating the wiring board 21, for example, the metal foil 13 on the surface of the metal-clad laminate 11 obtained above is etched to form a circuit (wiring), whereby the wiring board 21 having a conductor pattern (wiring 14) provided as a circuit on the surface of a laminate can be obtained. Examples of the circuit forming method include circuit formation by a semi additive process (SAP) or a modified semi additive process (MSAP) in addition to the method described above.

The prepreg, film with resin, and metal foil with resin obtained using the resin composition of the present embodiment are extremely useful in industrial applications since the cured products thereof exhibit low dielectric properties and high Tg as well as excellent toughness and handleability. The metal-clad laminate and wiring board obtained by curing these have the advantages of low dielectric properties, high Tg, and excellent handleability.

Hereinafter, the present invention will be described more specifically with reference to Examples, but the scope of the present invention is not limited to these.

EXAMPLES

First, the respective components used in the preparation of resin compositions in the present Example will be described.

(Polyphenylene Ether Compound)

PPE1: Modified polyphenylene ether obtained by modifying a terminal hydroxyl group of polyphenylene ether with a methacrylic group (SA9000 manufactured by SABIC Innovative Plastics Co., Ltd., intrinsic viscosity (IV): 0.085 dl/g in methylene chloride at 25° C., weight average molecular weight Mw: 1700, number of terminal functional groups: 1.8)

The intrinsic viscosity is the viscosity of a methylene chloride solution (liquid temperature: 25° C.) of modified polyphenylene ether at 0.18 g/45 ml measured using a viscometer (AVS500 Visco System manufactured by SCHOTT Instruments GmbH).

PPE2: Bifunctional vinylbenzyl modified PPE (Mw: 1700)

First, modified polyphenylene ether (modified PPE-1) was synthesized. The average number of phenolic hydroxyl groups at the terminals of the molecule per one molecule of polyphenylene ether is denoted as the number of terminal hydroxyl groups.

Modified polyphenylene ether 1 (modified PPE-1) was obtained by reacting polyphenylene ether with chloromethylstyrene. Specifically, into a 1 L three neck flask equipped with a temperature controller, a stirrer, a cooling facility, and a dropping funnel, 200 g of polyphenylene ether (SA90 manufactured by SABIC Innovative Plastics Co., Ltd., intrinsic viscosity (IV): 0.083 dl/g, number of terminal hydroxyl groups: 1.9, weight molecular weight Mw: 1700), 30 g of a mixture of p-chloromethylstyrene and m-chloromethylstyrene at a mass ratio of 50:50 (chloromethylstyrene: CMS manufactured by Tokyo Chemical Industry Co., Ltd.), 1.227 g of tetra-n-butylammonium bromide as a phase transfer catalyst, and 400 g of toluene were first put and stirred. Then, the mixture was stirred until polyphenylene ether, chloromethylstyrene, and tetra-n-butylammonium bromide were dissolved in toluene. At that time, the mixture was gradually heated until the liquid temperature finally reached 75° C. Thereafter, an aqueous sodium hydroxide solution (20 g of sodium hydroxide/20 g of water) as an alkali metal hydroxide was added dropwise to the solution over 20 minutes. Thereafter, the mixture was further stirred at 75° C. for 4 hours. Next, the resultant in the flask was neutralized with hydrochloric acid at 10% by mass and then a large amount of methanol was added into the flask. By doing so, a precipitate was generated in the liquid in the flask. In other words, the product contained in the reaction solution in the flask was reprecipitated. Thereafter, this precipitate was taken out by filtration, washed three times with a mixed solution of methanol and water contained at a mass ratio of 80:20, and then dried under reduced pressure at 80° C. for 3 hours.

The obtained solid was analyzed by $^1$H-NMR (400 MHz, $CDCl_3$, TMS). As a result of NMR measurement, a peak attributed to ethenylbenzyl was confirmed at 5 to 7 ppm. This confirmed that the obtained solid was polyphenylene ether in which the terminals of the molecule were ethenylbenzylated.

The molecular weight distribution of the modified polyphenylene ether was measured by GPC. Then, the weight average molecular weight (Mw) was calculated from the obtained molecular weight distribution, and as a result, Mw was 1,700.

The number of terminal functional groups in the modified polyphenylene ether was measured as follows.

First, the modified polyphenylene ether was accurately weighed. The weight at that time is defined as X (mg). Thereafter, this modified polyphenylene ether weighed was dissolved in 25 mL of methylene chloride, 100 μL of an ethanol solution of tetraethylammonium hydroxide (TEAR) at 10% by mass (TEAH:ethanol (volume ratio)=15:85) was added to the solution, and then the absorbance (Abs) of this mixture at 318 nm was measured using a UV spectrophotometer (UV-1600 manufactured by Shimadzu Corporation). Thereafter, the number of terminal hydroxyl groups in the modified polyphenylene ether was calculated from the measurement result using the following equation.

Residual OH amount (μmol/g)=[(25×Abs)/(ε× OPL×X)]×10$^6$

Here, ε indicates the extinction coefficient and is 4700 L/mol·cm. OPL denotes the cell optical path length and is 1 cm.

Since the calculated residual OH amount (the number of terminal hydroxyl groups) in the modified polyphenylene ether is almost zero, it was found that the hydroxyl groups in the polyphenylene ether before being modified are almost modified. From this fact, it was found that the number of terminal hydroxyl groups decreased from the number of terminal hydroxyl groups in polyphenylene ether before being modified is the number of terminal hydroxyl groups in polyphenylene ether before being modified. In other words, it was found that the number of terminal hydroxyl groups in polyphenylene ether before being modified is the number of terminal functional groups in the modified polyphenylene ether. In other words, the number of terminal functional groups was 1.8. This is denoted as "PPE2".

(Allyl Compound)
Production of Allyl Compound A

Into a 1 L three neck round bottom flask equipped with a stirrer and a condenser, 104.5 g (0.5 mol) of diallyl isocyanurate, 0.5 mol of an alkyl halide having 8 carbon atoms, 48.4 g (0.35 mol) of potassium carbonate, and 400 ml of N,N'-dimethylformamide as a solvent were put, the temperature was raised while performing stirring, and the temperature was maintained at 140° C. for 4 hours. Thereafter, the solvent was distilled off under reduced pressure, and then 400 mL of benzene was added to the reaction product to extract the desired product. This extract was washed with water and then dried over anhydrous magnesium sulfate, and benzene was distilled off, thereby obtaining allyl compound A: a long chain alkyl modified diallyl isocyanurate (8 carbon atoms).

Production of Allyl Compound B

Allyl compound B: long chain alkyl modified diallyl isocyanurate (12 carbon atoms) was obtained in the same manner as for allyl compound A except that the alkyl halide was changed to an alkyl halide having 12 carbon atoms.

Production of Allyl Compound C

Allyl compound C: long chain alkyl modified diallyl isocyanurate (14 carbon atoms) was obtained in the same manner as for allyl compound A except that the alkyl halide was changed to an alkyl halide having 14 carbon atoms.

Production of Allyl Compound D

Allyl compound D: long chain alkyl modified diallyl isocyanurate (18 carbon atoms) was obtained in the same manner as for allyl compound A except that the alkyl halide was changed to an alkyl halide having 18 carbon atoms.

Production of Allyl Compound E

Allyl compound E: long chain alkylene modified diallyl isocyanurate (10 carbon atoms) was obtained in the same manner as for allyl compound A except that the alkyl halide was changed to an alkylene halide having 10 carbon atoms.

(Other Curing Agents)
TAIC: Triallyl isocyanurate (manufactured by Nihon Kasei Co., Ltd.)
MeDAIC: Methyl diallyl isocyanurate (manufactured by SHIKOKU CHEMICALS CORPORATION)
TMAIC: Trimethallyl isocyanurate (manufactured by Nippon Kasei Co., Ltd.)
DVB-810: Divinylbenzene (manufactured by NIPPON STEEL Chemical & Material Co., Ltd.)

(Styrenic Polymer)
SEPTON V9827: Hydrogenated methylstyrene (ethylene/butylene) methylstyrene copolymer (manufactured by Kuraray Co., Ltd., weight average molecular weight: 92,000)
SEPTON 2002: Hydrogenated styrene (ethylene/propylene) styrene copolymer (manufactured by Kuraray Co., Ltd., weight average molecular weight: 54,000)
Tuftec H1041: Hydrogenated styrene (ethylene/butylene) styrene copolymer (manufactured by Asahi Kasei Corporation, weight average molecular weight: 75,000)
SIBSTAR073T: Styrene/isobutylene/styrenic triblock copolymer (manufactured by Kaneka Corporation, weight average molecular weight: 80,000)

(Reaction Initiator)
Peroxide: "PERBUTYL P", 1,3-bis(butylperoxyisopropyl)benzene (manufactured by NOF CORPORATION)

(Inorganic Filler)
Silica particles: "SC2300-SVJ" vinylsilane treated spherical silica (manufactured by ADMATECHS COMPANY LIMITED)

Examples 1 to 15 and Comparative Examples 1 to 6

Preparation Method (Resin Varnish)
First, the respective components, that is, resin components (PPE, allyl compound, styrenic polymer, and the like) were added to toluene at the blending proportion (parts by mass) described in Tables 1 and 2 so that the solid concentration was 60% by mass, and mixed. A peroxide, an inorganic filler, and the like were added to the mixture, stirring was performed for 60 minutes, and then dispersion was performed using a bead mill to obtain a resin varnish.
(Film with Resin and Evaluation Board)

Films with resin were fabricated using the respective resin varnishes of Examples and Comparative Examples prepared above. A PET film ("SP-PETO1" manufactured by Mitsui Chemicals Tohcello, Inc.) was used as the substrate. The resin varnish was applied to the substrate surface so that the thickness after drying was 130 μm or more, and this was heated and dried at 120° C. to 160° C. for about 2 to 5 minutes to obtain a film with resin. Then, the substrate was peeled off from the obtained film with resin, and the film with resin was sandwiched between copper foils having a thickness of 35 μm to be laminated, and heating and pressing was performed at a temperature of 200° C. and a pressure of 4 MPa for 2 hours to obtain an evaluation board having an insulating layer thickness of 130 μm.

Evaluation Test (Handleability: Cutter Cut)

A blade of a cutter knife was inserted into the evaluation hoard at an angle of 20°, and a cut of 10 cm in length was formed at a cutting speed of 2 cm/sec. The area of resin chipping around the formed cut was measured.

Excellent: Area of resin chipping around cut surface is less than 5 $mm^2$

Good: Area of resin chipping around cut surface is 5 $mm^2$ or more and less than 50 $mm^2$ Fair: Area of resin chipping around cut surface is 50 $mm^2$ or more and less than 100 $mm^2$ Poor: Area of resin chipping around cut surface is 100 $mm^2$ or more (Elastic Modulus)

The elastic modulus of the evaluation board was measured using a viscoelastic spectrometer "DMS100" manufactured by Seiko Instruments Inc. Specifically, dynamic viscoelasticity measurement (DMA) was performed with a tensile module at a frequency of 10 Hz to measure the storage elastic modulus E'(GPa) at room temperature (25° C.) when the temperature was raised from room temperature to 280° C. at a rate of temperature rise of 5° C./min.

In the present test, a low elastic modulus indicates high toughness, and an elastic modulus of 4 GPa or less is taken as the acceptance line.
(Glass Transition Temperature (Tg))

The Tg of the evaluation board was measured using a viscoelastic spectrometer "DMS100" manufactured by Seiko Instruments Inc. At this time, dynamic viscoelasticity measurement (DMA) was performed with a tensile module at a frequency of 10 Hz, and the temperature at which tan δ was maximized when the temperature was raised from room temperature to 300° C. at a rate of temperature rise of 5° C./min was taken as Tg. In the present Example, it is determined as acceptable when the Tg is 160° C. or more.
(Dielectric Properties: Dielectric Loss Tangent (Df))

The dielectric loss tangent (Df) of the evaluation board was measured by the cavity resonator perturbation method. Specifically, the dielectric loss tangent (DO of the test piece at 10 GHz were measured using a network analyzer (N5230A manufactured by Agilent Technologies, Inc.). In the present Example, it is determined as acceptable when the Df is 0.0016 or less.
(Resin Flowability)

The resin flowability was evaluated using the film with resin. The resin varnishes of Examples 1 to 15 were subjected to measurement in conformity with IPC-TM-650. The molding conditions were set to 171° C. and a pressure of 14 kgf/$cm^2$, and the film was pressed using a hot plate for 15 minutes. As the number of films with resin used for measurement, two films with resin fabricated as described above were used. The value of resin flowability indicates superiority or inferiority of circuit filling properties. In a case where the resin flowability value is too low, the resin composition derived from the film with resin does not sufficiently enter between the circuits, and voids are formed. In the present Example, it is determined as acceptable when the resin flowability is 10% or more.

The results are presented in Tables 1 and 2.

TABLE 1

| | | Example | | | | | | | | | | | | | | |
|---|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 | 15 |
| Polyphenylene ether | PPE1 | 40 | 40 | 40 | 40 | 40 | 40 | 40 | 40 | 30 | 56 | 30 | 20 | | 40 | 50 |
| | PPE2 | | | | | | | | | | | | | 40 | | |
| Curing agent | Allyl compound A | 40 | | | | | | | | | | | | | | |
| | Allyl compound B | | 40 | | | | 40 | 40 | 40 | 50 | 24 | 30 | 20 | 40 | 40 | 50 |
| | Allyl compound C | | | 40 | | | | | | | | | | | | |
| | Allyl compound D | | | | 40 | | | | | | | | | | | |
| | Allyl compound E | | | | | 40 | | | | | | | | | | |
| | TAIC | | | | | | | | | | | | | | | |
| | MeDAIC | | | | | | | | | | | | | | | |
| | TMAIC | | | | | | | | | | | | | | | |
| | DVB-810 | | | | | | | | | | | | | | | |
| Styrenic polymer | SEPTON V9827 | 20 | 20 | 20 | 20 | 20 | | | | 20 | 20 | 40 | 60 | 20 | 20 | |
| | SEPTON 2002 | | | | | | 20 | | | | | | | | | |
| | Tuftec H1041 | | | | | | | 20 | | | | | | | | |
| | SIBSTAR073T | | | | | | | | 20 | | | | | | | |
| | PURBUTYL P | | | | | | | | | | | | | | | |
| Reaction initiator | | 1 | 1 | 1 | 1 | 1 | 1 | 1 | 1 | 1 | 1 | 1 | 1 | 1 | 1 | 1 |
| Inorganic filler | SC2300-SVJ | 200 | 200 | 200 | 200 | 200 | 200 | 200 | 200 | 200 | 200 | 200 | 200 | 200 | 70 | 70 |
| Evaluation | Item | | | | | | | | | | | | | | | |
| | Handling | Good | Excellent | Excellent | Excellent | Good | Excellent | Excellent | Good | Excellent | Good | Excellent | Excellent | Good | Excellent | Fair |
| | Elastic modulus | 4 | 4 | 4 | 4 | 4 | 3 | 4 | 4 | 4 | 6 | 3 | 2 | 4 | 2 | 4 |
| | Tg | 185 | 180 | 180 | 175 | 185 | 184 | 180 | 166 | 170 | 190 | 200 | 170 | 180 | 180 | 170 |
| | Resin flowability | 15 | 15 | 15 | 13 | 15 | 15 | 15 | 17 | 25 | 10 | 10 | 0 | 15 | 40 | 50 |
| | Dielectric loss tangent @ 10 GHz | 0.0016 | 0.0016 | 0.0016 | 0.0015 | 0.0015 | 0.0015 | 0.0016 | 0.0016 | 0.0016 | 0.0016 | 0.0013 | 0.0012 | 0.0016 | 0.0013 | 0.0016 |

TABLE 2

|  |  | Comparative Example | | | | | |
|---|---|---|---|---|---|---|---|
|  |  | 1 | 2 | 3 | 4 | 5 | 6 |
| Polyphenylene ether compound | PPE1 | 40 | 40 | 40 | 40 | | |
|  | PPE2 | | | | | | |
| Curing agent | Allyl compound A | | | | | | |
|  | Allyl compound B | | | | | | |
|  | Allyl compound C | | | | | | |
|  | Allyl compound D | | | | | | |
|  | Allyl compound E | | | | | | |
|  | TAIC | 40 | | | | | |
|  | MeDAIC | | 40 | | | | |
|  | TMAIC | | | 40 | | | |
|  | DVB-810 | | | | 40 | | |
| Styrenic polymer | SEPTON V9827 | 20 | 20 | 20 | 20 | 20 | 50 |
|  | SEPTON 2002 | | | | | | |
|  | Tuftec H1041 | | | | | | |
|  | SIBSTAR073T | | | | | | |
| Reaction initiator | PURBUTYL P | 1 | 1 | 1 | 1 | 1 | 1 |
| Inorganic filler | SC2300-SVJ | 200 | 200 | 200 | 200 | 200 | 200 |
| Evaluation | Item | | | | | | |
|  | Handling | Poor | Poor | Poor | Poor | Poor | Excellent |
|  | Elastic modulus | 8 | 7 | 8 | 7 | — | 2 |
|  | Tg | 250 | 240 | 240 | 230 | — | 110 |
|  | Resin flowability | 5 | 10 | 5 | 3 | 25 | 10 |
|  | Dielectric loss tangent @10 GHz | 0.0018 | 0.0018 | 0.0017 | 0.0015 | 0.0018 | 0.0014 |

(Discussion)

As is clear from the results presented in Table 1, it was confirmed that a cured product exhibiting excellent handleability and toughness as well as low dielectric properties and high Tg is obtained from the resin composition of the present invention. Furthermore, the resin compositions of Examples related to the present invention also exhibit excellent resin flowability, and is thus considered to be advantageous in circuit filling when a multilayer wiring board and the like are fabricated.

Particularly in a case where an allyl compound in which $R^4$ in Formula (3) is an alkyl or alkenyl group having 8 to 18 carbon atoms is used and a case where a styrenic polymer is used concurrently, it was also confirmed that the handleability is superior.

In contrast, as is clear from Table 2, in Comparative Examples 1 to 4 in which the allyl compound according to the present invention is not used, it was found that the elastic modulus is increased and the handleability is poor. In Comparative Example 5 in which a polyphenylene ether compound is not contained but the amount of allyl compound added is increased, it was found that the cured product is brittle, thus the elastic modulus and the like cannot be measured, and the handleability is poor. In Comparative Example 6, in which a styrenic polymer is added instead of a polyphenylene ether compound, the handleability is favorable but a sufficient Tg cannot be obtained.

This application is based on Japanese Patent Application No. 2020-146564 filed on Sep. 1, 2020, the contents of which are included in the present application.

In order to express the present invention, the present invention has been described above appropriately and sufficiently through the embodiments with reference to specific examples, drawings and the like. However, it should be recognized by those skilled in the art that changes and/or improvements of the above-described embodiments can be readily made. Accordingly, changes or improvements made by those skilled in the art shall be construed as being included in the scope of the claims unless otherwise the changes or improvements are at the level which departs from the scope of the appended claims.

INDUSTRIAL APPLICABILITY

The present invention has a wide range of industrial applicability in the technical field relating to electronic materials and various devices using the same.

The invention claimed is:

1. A resin composition comprising:
a polyphenylene ether compound having at least one of groups represented by the following Formulas (1) and (2); and
an allyl compound represented by the following Formula (3):

[Chemical formula 1]

(1)

(in Formula (1), p represents an integer 0 to 10, Z represents an arylene group, and $R_1$ to $R_3$ each independently represent a hydrogen atom or an alkyl group)

[Chemical formula 2]

(2)

(in Formula (2), $R_4$ represents a hydrogen atom or an alkyl group)

[Chemical formula 3]

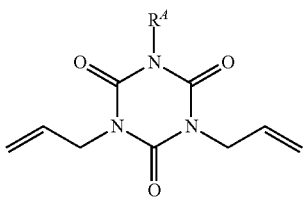

(3)

(in Formula (3), $R^4$ represents an alkyl or alkenyl group having 8 to 22 carbon atoms).

2. The resin composition according to claim 1, further comprising an inorganic filler.

3. The resin composition according to claim 1, comprising the allyl compound at 10 to 50 parts by mass with respect to 100 parts by mass of a sum of the polyphenylene ether compound and the allyl compound.

4. The resin composition according to claim 1, further comprising a styrenic polymer having a structural unit represented by the following Formula (15):

[Chemical formula 4]

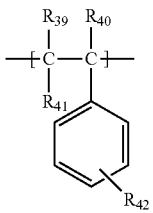

(15)

(in Formula (15), $R_{39}$ to $R_{41}$ each independently represent a hydrogen atom or an alkyl group, and $R_{42}$ represents a group selected from the group consisting of a hydrogen atom, an alkyl group, an alkenyl group, and an isopropenyl group).

5. The resin composition according to claim 4, comprising the allyl compound at 10 to 50 parts by mass with respect to 100 parts by mass of a sum of the polyphenylene ether compound, the allyl compound, and the styrenic polymer.

6. The resin composition according to claim 4, wherein a weight average molecular weight of the styrenic polymer is 10,000 to 300,000.

7. The resin composition according to claim 4, wherein the styrenic polymer is at least one selected from the group consisting of a hydrogenated methylstyrene (ethylene/butylene) methylstyrene copolymer, a hydrogenated methylstyrene (ethylene-ethylene/propylene) methylstyrene copolymer, a hydrogenated styrene isoprene copolymer, a hydrogenated styrene isoprene styrene copolymer, a hydrogenated styrene (ethylene/butylene) styrene copolymer, a hydrogenated styrene (ethylene/propylene) styrene copolymer, a hydrogenated styrene (ethylene-ethylene/propylene) styrene copolymer, a styrene-isobutylene copolymer, and a styrene-isobutylene-styrene copolymer.

8. The resin composition according to claim 4, comprising the styrenic polymer at 10 to 60 parts by mass with respect to 100 parts by mass of a sum of the polyphenylene ether compound, the allyl compound, and the styrenic polymer.

9. The resin composition according to claim 1, further comprising a reaction initiator.

10. A prepreg comprising:
the resin composition according to claim 1 or a semi-cured product of the resin composition; and
a fibrous substrate.

11. A film with resin comprising:
a resin layer containing the resin composition according to claim 1 or a semi-cured product of the resin composition; and
a support film.

12. A metal foil with resin comprising:
a resin layer containing the resin composition according to claim 1 or a semi-cured product of the resin composition; and
a metal foil.

13. A metal-clad laminate comprising:
an insulating layer containing a cured product of the resin composition according to claim 1; and
a metal foil.

14. A wiring board comprising:
an insulating layer containing a cured product of the resin composition according to claim 1; and
wiring.

15. A metal-clad laminate comprising:
an insulating layer containing a cured product of the prepreg according to claim 10; and
a metal foil.

16. A wiring board comprising:
an insulating layer containing a cured product of the prepreg according to claim 10; and
wiring.

* * * * *